(12) United States Patent
Alenin et al.

(10) Patent No.: US 7,471,150 B2
(45) Date of Patent: Dec. 30, 2008

(54) CLASS AB FOLDED CASCODE STAGE AND METHOD FOR LOW NOISE, LOW POWER, LOW-OFFSET OPERATIONAL AMPLIFIER

(75) Inventors: Sergey V. Alenin, Tucson, AZ (US); Henry Surtihadi, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 48 days.

(21) Appl. No.: 11/279,416

(22) Filed: Apr. 12, 2006

(65) Prior Publication Data

US 2007/0241818 A1    Oct. 18, 2007

(51) Int. Cl.
  *H03F 3/45* (2006.01)
(52) U.S. Cl. .................. 330/257; 330/255
(58) Field of Classification Search .......... 330/257, 330/252, 255, 292
  See application file for complete search history.

(56) References Cited

U.S. PATENT DOCUMENTS 6,788,146 B2*  9/2004  Forejt et al. .................. 330/257

* cited by examiner

*Primary Examiner*—Robert Pascal
*Assistant Examiner*—Hieu P Nguyen
(74) *Attorney, Agent, or Firm*—Warren L. Franz; Wade J. Brady, III; Frederick J. Telecky, Jr.

(57) ABSTRACT

A class AB folded cascode circuit includes a differential current follower having first and second cascode transistors with emitters connected to first and second input conductors. An input of a first current mirror is coupled to the first input conductor, and an input of a second current mirror is coupled to the second input conductor. Outputs of the second and first current mirrors are coupled to collectors of the first and second cascode transistors, respectively, and also to first and second outputs, respectively, of the differential current follower. A third current mirror converts a differential output current in the first and second output conductors to a corresponding single-ended output voltage on the second output conductor.

16 Claims, 2 Drawing Sheets

CLASS AB FOLDED CASCODE STAGE AND METHOD FOR LOW NOISE, LOW POWER, LOW-OFFSET OPERATIONAL AMPLIFIER

BACKGROUND OF THE INVENTION

The present invention relates generally to amplifiers employing folded cascode topology, and more particularly to improved low noise, low quiescent current, low offset operational amplifiers having a large common mode input voltage range.

One of the most frequently used input-stage topologies which provides wide input common-mode range is the folded cascode arrangement, shown as a generalized block diagram in FIG. 1. The amplifier in FIG. 1 includes a pair of input transistors (not shown) in block 30, the base or gate of one input transistor being coupled to Vin− the base or gate of the other input transistor being coupled to Vin+. A tail current source $I_0$ is coupled to the emitters or sources of the input transistors, and their collectors or drains are coupled to load resistors R1 and R2 and also to emitters or sources of a pair of cascode transistors (not shown), respectively, in block 31. The collectors or drains of the cascode transistors in block 31 are coupled by a load circuit 5 to $V_{CC}$ and to inputs of an output amplifier stage 9 which produces Vout. Compensation capacitor C1 is coupled between Vout and the (−) input of output stage 9, and compensation capacitor C2 is coupled between $V_{EE}$ and to the (+) input of output stage 9.

FIG. 2 shows a schematic diagram of a different and simpler amplifier configuration, in which the differential input transistor pair includes a pair of JFET input transistors J0 and J1 having their sources coupled to a tail current source $I_0$ and their gates coupled to Vin− and Vin+, respectively. The drains of input transistors J0 and J1 are coupled to $V_{EE}$ through NPN active load transistors Q17 and Q18 and degeneration resistors R1 and R2 as shown. The drains of input transistors J0 and J1 are connected to bases of the input transistors Q12 and Q13, respectively, of a second amplifier stage. The emitters of transistors Q12 and Q13 are connected to a tail current source $I_3$ and to the bases of active load transistors Q17 and Q18. The collectors of transistors Q12 and Q13 are coupled to an active load circuit Q14, Q15 of the second amplifier stage. A compensation capacitor C1 is coupled between the base and collector of transistor Q13, and compensation capacitor C2 is connected between the base of transistor Q12 and $V_{EE}$.

In the simpler differential pair topology shown in FIG. 2, the slew rate is determined simply by the magnitude of the tail current $I_0$ and the size of the compensation capacitor C1.

However, in the more complex folded cascode topology of FIG. 1, the slew rate is determined not only by the magnitude of the tail current source $I_0$ and the size of the compensation capacitor C1, but is additionally determined by the amount of current flowing through the cascode transistors in block 31.

Thus, when comparing the folded cascode topology of FIG. 1 to a simple differential pair topology as shown in FIG. 2, it can be seen that the folded cascode topology will need to have higher quiescent current to achieve comparable slewing performance.

In order to make the slew rate of an operational amplifier having the folded cascode circuitry of FIG. 1 comparable to the slew rate of a second stage or output stage that has the simple differential input pair Q12,Q13 in FIG. 2, the cascoding transistors in block 31 of FIG. 1 must conduct the same amount of current as the input pair transistors in block 30 of FIG. 1. Unfortunately, this not only causes higher quiescent current in the folded cascode amplifier in FIG. 1, but also approximately doubles the amount of current flowing into load resistors R1 and R2, and therefore approximately doubles the voltage drop across them. Consequently, the common mode input voltage range is substantially reduced in the folded cascode amplifier of FIG. 1 if it is designed to have slewing performance comparable to that of the simpler differential pair topology of FIG. 2.

As a practical matter, the resistances of load resistors R1 and R2 in the folded cascode amplifier of FIG. 1 cannot be substantially reduced because that would increase the folded cascode stage transconductance Gm presented to the cascoding transistors in block 31, which in turn would increase its noise and offset noise contribution. (It should be noted that folded cascode topology can also be implemented using current sources in place of resistors R1 and R2 in FIG. 1. However, although the cascode transistors in block 31 of FIG. 1 can be degenerated by very high output resistances of those current sources, in practice such current sources themselves become noise and offset contributors.)

In order to minimize the quiescent current and the noise contribution of the folded cascode transistors in block 31 of FIG. 1, the amount of current flowing through the folded cascode transistors can be reduced. Furthermore, decreasing the quiescent current through the cascode transistors in block 31 increases the output resistance of the folded cascode stage and that, in turn, increases the voltage gain of the amplifier. The improved voltage gain is useful to minimize the noise and offset voltage contributions of any following stages (if present) when the noise and offset voltage contributions are referred back to the input terminals of the pair of input transistors in block 30. Unfortunately, reducing the quiescent current through the folded cascode transistors in block 31 of FIG. 1 reduces the slew rate of the folded cascode amplifier, as explained above.

There are known "slew boost" techniques for improving slew rate when quiescent current in the folded cascode stage is reduced. However, the known slew boost techniques use nonlinear types of slew boost circuits that boost the current flowing through the folded cascode stage or bypassing it. However, employing a nonlinear slew boost circuit in an amplifier results in additional signal distortion.

There is an unmet need for a low noise, low offset operational amplifier which has improved common mode input voltage range and high slew rates.

There also is an unmet need for an operational amplifier using folded cascode topology with the folded cascode stage running lower current than the differential input stage for improved noise and offset performance and/or wider common mode input voltage range while providing slew rate performance determined by a full amount of output current of the differential input transistor pair, without substantial degradation of linearity when the operational amplifier approaches a slewing condition.

SUMMARY OF THE INVENTION

It is an object of the invention to provide a low noise, low offset operational amplifier which has improved common mode input voltage range and high slew rates.

It is another object of the invention to provide an operational amplifier using folded cascode topology with the folded cascode stage running lower current than the differential input stage for improved noise and offset performance and/or wider common mode input voltage range while providing slew rate performance determined by a full amount of output current of the differential input transistor pair, without substantial degradation of linearity when the operational amplifier approaches a slewing condition.

Briefly described, and in accordance with one embodiment, the present invention provides a class AB folded cascode circuit (19A) that includes a differential current follower (34A) having first (Q20) and second (Q21) cascode transistors with emitters connected to first (2) and second (1) input conductors. An input of a first current mirror (Q22,Q23) is coupled to the first input conductor, and an input of a second current mirror (Q25,Q26) is coupled to the second input conductor. Outputs of the second and first current mirrors are coupled to collectors of the first and second cascode transistors, respectively, and also to first (3) and second (4) outputs, respectively, of the differential current follower. A third current mirror (34B) converts a differential output current in the first (3) and second (4) output conductors to a corresponding single-ended output voltage on the second output conductor.

In one embodiment, the invention provides a class AB folded cascode circuit (19A) including a differential current follower circuit (34A) including first (Q20) and second (Q21) cascode transistors each having a first electrode, a second electrode, and a control electrode, the control electrodes being coupled to a bias voltage (Vbias), the differential current follower circuit (34A) having a first input conductor (2) coupled to the first electrode of the first cascode transistor (Q20), a second input conductor (1) coupled to the first electrode of the second cascode transistor (Q21), a first output conductor (3) coupled to the second electrode of the first cascode transistor (Q20), and a second output conductor (4) coupled to the second electrode of the second cascode transistor (Q21). The differential current follower circuit also includes a first current mirror circuit (Q22,Q23) having an input coupled to the first input conductor (2) and an output (16) coupled to the second output conductor (4), and a second current mirror circuit (Q25,Q26) having an input coupled to the second input conductor (1) and an output (15) coupled to the first output conductor (3). The differential current follower circuit (34A) produces a differential output current in the first (3) and second (4) output conductors which follows a differential input current forced into the first (2) and second (1) input conductors. A third current mirror circuit (34B) converts a differential output current in the first (3) and second (4) output conductors to a corresponding single-ended output voltage on the second output conductor (4).

In a described embodiment, the output (16) of the first current mirror circuit (Q22,Q23) is coupled to the second output conductor (4) by means of a third cascode transistor (Q24) having a first electrode coupled to the output (16) of the first current mirror circuit, a second electrode coupled to the second output conductor (4), and a control electrode coupled to the bias voltage (Vbias), and wherein the output (15) of the second current mirror circuit (Q25,Q26) is coupled to the first output conductor (3) by means of a fourth cascode transistor (Q27) having a first electrode coupled to the output (15) of the second current mirror circuit, a second electrode coupled to the first output conductor (3), and a control electrode coupled to the bias voltage (Vbias).

In a described embodiment, the first current mirror circuit (Q22,Q23) includes a first current mirror input transistor (Q22) having a first electrode coupled to a first reference voltage ($V_{EE}$) and a control electrode and a second electrode coupled to the first input conductor (2) and a first current mirror output transistor (Q23) having a first electrode coupled to the first reference voltage ($V_{EE}$), a control electrode coupled to the control electrode of the first current mirror input transistor (Q22), and a second electrode coupled to the second output conductor (4), and wherein the second current mirror circuit (Q25,Q26) includes a second current mirror input transistor (Q25) having a first electrode coupled to the first reference voltage ($V_{EE}$) and a control electrode and a second electrode coupled to the second input conductor (1) and a second current mirror output transistor (Q26) having a first electrode coupled to the first reference voltage ($V_{EE}$), a control electrode coupled to the control electrode of the second current mirror input transistor (Q25), and a second electrode coupled to the first output conductor (3).

A bias circuit (40) includes a third current mirror input transistor (Q33) having a first electrode coupled to the first reference voltage ($V_{EE}$), a third current mirror output transistor (Q32) having a first electrode coupled to the first reference voltage ($V_{EE}$), a control electrode coupled to a control electrode and a second electrode of the third current mirror input transistor (Q33), a diode-connected transistor (Q34) having a first electrode coupled to a second electrode of the third current mirror output transistor (Q32) and a second electrode and a control electrode coupled to a bias current source ($I_{11}$) and a control electrode of a follower transistor (Q35) having a first electrode coupled to the second electrode of the third current mirror input transistor (Q33), the bias voltage (Vbias) being produced on the control electrode of the diode-connected transistor (Q34).

In a described embodiment, the invention provides an operational amplifier circuit (10D) including an input stage (11) including first (Q0) and second (Q1) input transistors coupled to a tail current source ($I_0$) and to first ($I_9$) and second ($I_{10}$) load devices, respectively, wherein a class AB folded cascode circuit (19A) includes a differential current follower circuit (34A). The differential current follower circuit includes first (Q20) and second (Q21) cascode transistors each having a first electrode, a second electrode, and a control electrode, the control electrodes being coupled to a bias voltage (Vbias), the differential current follower circuit (34A) having a first input conductor (2) coupled to the first electrode of the first cascode transistor (Q20), a second input conductor (1) coupled to the first electrode of the second cascode transistor (Q21), a first output conductor (3) coupled to the second electrode of the first cascode transistor (Q20), and a second output conductor (4) coupled to the second electrode of the second cascode transistor (Q21). A first current mirror circuit (Q22,Q23) has an input coupled to the first input conductor (2) and an output (16) coupled to the second output conductor (4), and a second current mirror circuit (Q25,Q26) has an input coupled to the second input conductor (1) and an output (15) coupled to the first input conductor (3). The differential current follower circuit (34A) produces a differential output current in the first (3) and second (4) conductors which follows a differential input current forced into the first (2) and second (1) input conductors. A third current mirror circuit (34B) converts differential output current in the first (3) and second (4) output conductors to a corresponding single-ended output voltage on the second output conductor (4). An output stage (20) has an input coupled to one of the first (3) and second (4) output conductors.

In one embodiment, the invention provides a class AB folded cascode circuit (19A) including first (Q20) and second (Q21) cascode transistors each having a first electrode, a second electrode, and a control electrode, the control electrodes being coupled to a bias voltage (Vbias), the differential current follower circuit (34A) having a first input conductor (2) coupled to the first electrode of the first cascode transistor (Q20), a second input conductor (1) coupled to the first electrode of the second cascode transistor (Q21), a first output conductor (3) coupled to the second electrode of the first cascode transistor (Q20), and a second output conductor (4) coupled to the second electrode of the second cascode transistor (Q21), means (2) for coupling an input of a first current mirror circuit (Q22,Q23) to the first input conductor, means (16/Q24) for coupling an output of the first current mirror circuit (Q22,Q23) to the second output conductor (4), means (1) for coupling an input of a second current mirror circuit (Q25,Q26) to the second input conductor, means (15/Q27) for coupling an output of the second current mirror circuit (Q25, Q26) to the first output conductor (3), means (1,2) for introducing a differential input current into the first and second input conductors to cause a differential output current to flow in the first (3) and second (4) output conductors, and means (34B) for converting the differential output current flowing in the first (3) and second (4) output conductors to a corresponding single-ended output voltage on the second output conductor (4).

DETAILED DESCRIPTION OF THE PREFERRED EMBODIMENTS

Figure 1:
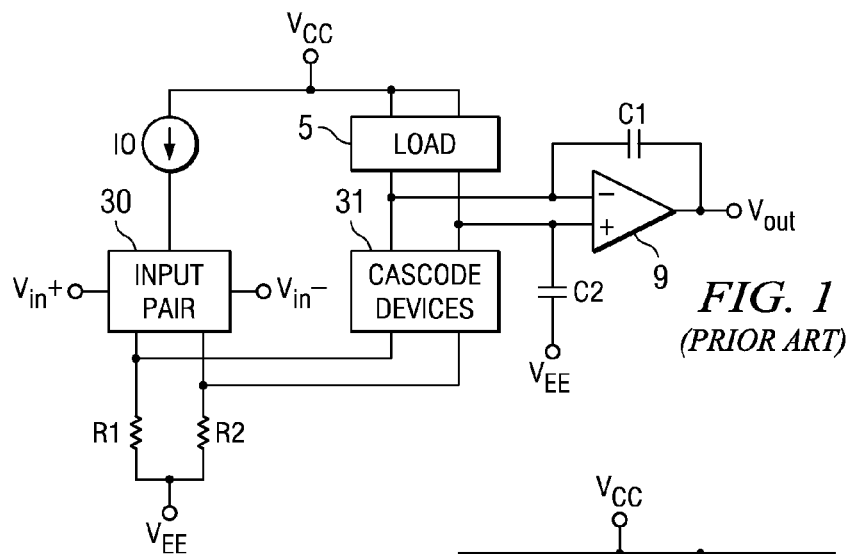
FIG. 1 is a block diagram of a prior art operational amplifier.
Figure 2:
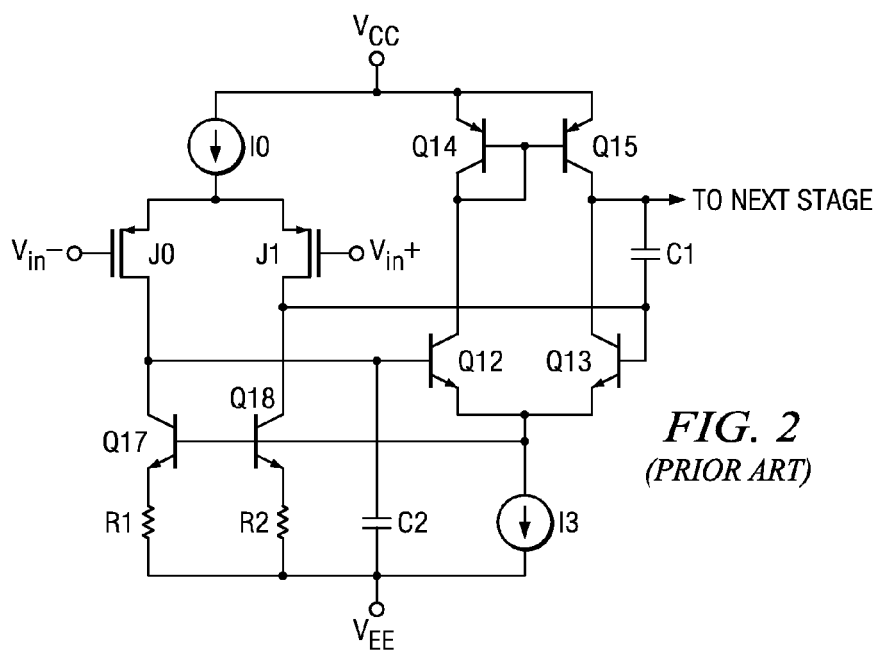
FIG. 2 is a schematic diagram of a prior art input stage including a folded cascode circuit.
Figure 3:
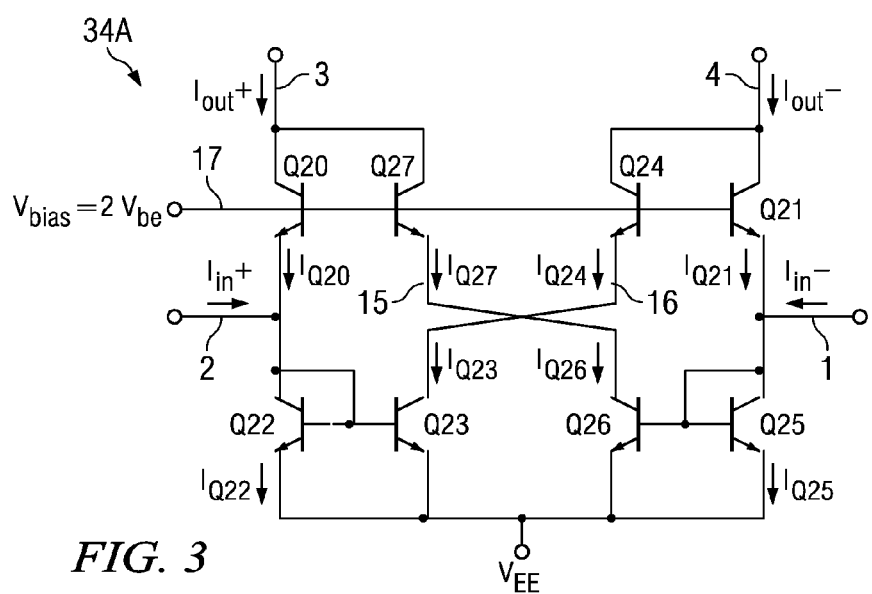
FIG. 3 is a schematic diagram of a class AB folded cascode stage according to the present invention.

FIG. 3 shows a differential current follower circuit 34A which can be used in an operational amplifier. Referring to FIG. 3, differential current follower circuit 34A includes a differential common base stage including standard NPN folded cascode transistors Q20 and Q21, the collectors of which can be connected to conductors 3 and 4, respectively, in subsequently described FIG. 4. The emitter of cascode transistor Q20 is connected by conductor 2 of subsequently described FIG. 4 to the collector and base of NPN current mirror input transistor Q22 and to the base of NPN current mirror output transistor Q23. Similarly, the emitter of cascode transistor Q21 is connected by conductor 1 of subsequently described FIG. 4 to the collector and base of NPN current mirror input transistor Q25 and to the base of NPN current mirror output transistor Q26. The emitters of current mirror transistors Q22, Q23, Q25, and Q26 are connected to $V_{EE}$. The collector of current mirror output transistor Q23 is coupled to conductor 4 either through the emitter and collector of NPN cascode transistor Q24 as shown, or directly. Similarly, the collector of current mirror output transistor Q26 is coupled to conductor 3 either through the emitter and collector of NPN cascode transistor Q27 as shown, or directly. A bias voltage Vbias is applied by conductor 17 to the bases of cascode transistors Q20, Q21, Q24, and Q27. The emitters of cascode transistors Q20 and Q21 form the (+) input conductor 2 and the (−) input conductor 1, respectively, of differential current follower circuit 34A. Conductors 3 and 4 form the (+) and (−) outputs, respectively, of differential current follower circuit 34A.

With Vbias equal to 2 base-emitter (Vbe) voltage drops, the quiescent current flowing through transistors Q20, Q22 and Q21, Q25, which is also mirrored into transistors Q23 and Q26, is set to a low level compared to the tail current $I_0$ of the input stage 11 (typically one fourth to one tenth of $I_0$) in operational amplifier 10D of subsequently described FIG. 4, which includes differential current follower circuit 34A of FIG. 3. In that case transistors Q20, Q21, Q22, Q23, Q25, and Q26 do not contribute much noise in operational amplifier 10D because they are conducting low quiescent current which sets their gm values low, compared to gm of the input stage, without additional degeneration resistors.

It can be seen that input conductors 2 and 1 of differential current follower circuit 34A can both source and sink a large amount of current to or from a preceding stage. That is, there is no inherent limit for input-output current other than limitations due to practical transistor geometries and operational parameters. This can be shown by the following analysis, wherein the subscripts of the current variables in the following equations designate the transistors in FIG. 4 through which the corresponding currents flow. In accordance with Kirchhoffs Laws, $I_{Q20} - I_{Q22} = I\text{in}+$, $I_{Q21} - I_{Q25} = I\text{in}-$, $I_{Q22} = I_{Q23} = I_{Q24}$, and $I_{Q25} = I_{Q26} = I_{Q27}$.

Substituting terms results in $I\text{out}+ = I_{Q20} + I_{Q27} = I_{Q20} + I_{Q25}$, and $I\text{out}- = I_{Q21} + I_{Q24} = I_{Q21} + I_{Q22}$.

Consequently, $$I\text{out}+ - I\text{out}- = I_{Q22} + I_{Q25} - I_{Q21} - I_{Q22}$$
$$= (I_{Q20} - I_{Q22}) - (I_{Q21} - I_{Q25})$$
$$= I\text{in}+ - I\text{in}-.$$

Thus, differential current follower circuit 34A actually performs a function that can be considered to be the basic function of a folded cascode stage. It has the capability of, in effect, "passing through" nearly unlimited current from its input terminals to its output terminals while conducting quiescent current which is much lower than maximum signal current.

Figure 4:
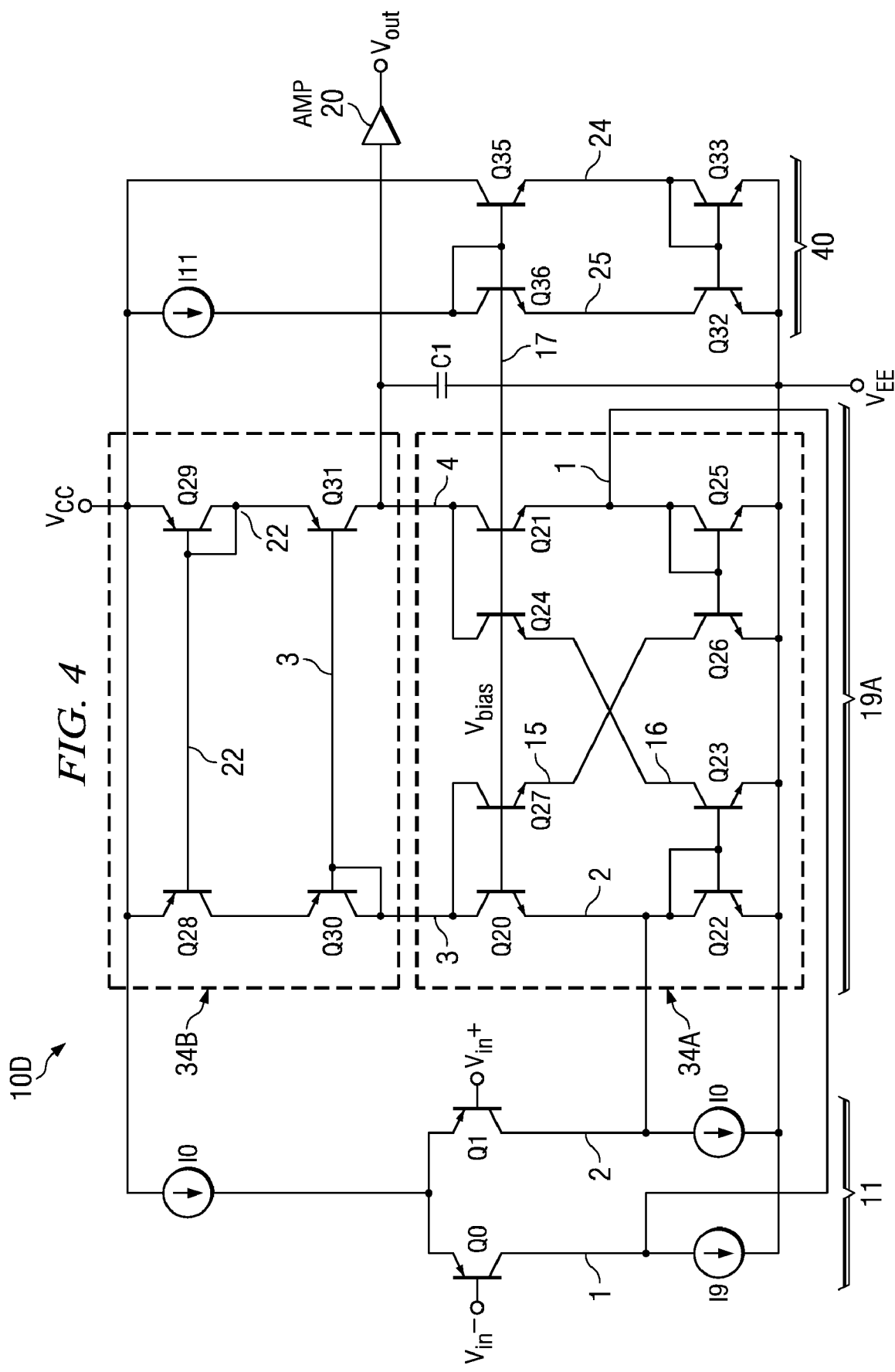
FIG. 4 is an operational amplifier including the class AB folded cascode stage of FIG. 3.

Referring to FIG. 4, above mentioned operational amplifier 10D includes a differential input stage 11 similar to input stage 11 of FIG. 5, a folded cascode stage 19A which includes differential follower circuit 34A of FIG. 3, a current mirror circuit 34B, a bias voltage generator 40, and an output amplifier 20. Class AB folded cascode stage 19A is connected to differential input stage 11, which includes PNP input transistors Q0 and Q1 having their bases connected to Vin− and Vin+, respectively. Their emitters are connected to tail current source $I_0$, and their collectors are connected by conductors 1 and 2 to active load current sources $I_9$ and $I_{10}$, respectively. Output conductor 3 of differential current follower circuit 34A of FIG. 3 is connected to the collector and base of a diode-connected PNP transistor Q30, which included in current mirror 34B. Current mirror 34B also includes PNP transistors Q28, Q29, and Q31. The emitter of transistor Q30 is connected to the collector of PNP current mirror output transistor Q28. Output conductor 4 of differential current follower circuit 34A is connected to the collector of a PNP transistor Q31, the base of which is connected by conductor 3 to the base and collector of diode-connected transistor Q30. The emitter of transistor Q31 is connected by conductor 22 to the base and collector of a PNP current mirror input transistor Q29 and to the base of PNP current mirror output transistor Q28. The emitters of current mirror transistors Q28 and Q29 are connected to $V_{CC}$. Conductor 4 also is connected to one terminal of a compensation capacitor C1 and to the input of a second stage amplifier 20 which produces Vout. The circuitry of current mirror 34B including PNP transistors Q28, Q29, Q30, and Q31 is a Wilson current mirror with the base of transistor Q31 being its input and the collector of transistor Q31 being its output. Diode-connected transistor Q30 can be omitted (by connecting conductor 3 to the collector of transistor Q28), since the purpose of Q30 diode is just to equalize collector voltages of transistors Q28 and Q29 and thereby better balance them.

The bias voltage Vbias applied by conductor 17 to the bases of transistors Q20, Q27, Q24, and Q21 of class AB folded cascode stage 34A is produced by bias voltage generator circuit 40, which includes an NPN current mirror input transistor Q33, an NPN current mirror output transistor Q32, an NPN transistor Q35, a diode-connected NPN transistor Q36, and a current source $I_{11}$. The emitters of NPN current mirror transistors Q32 and Q33 are connected to $V_{EE}$. The collector and base of current mirror input transistor Q33 are connected by conductor 24 to the emitter of transistor Q35, the base of which is connected to the base and collector of diode-connected NPN transistor Q36 and to current source $I_{11}$. The emitter of diode-connected transistor Q36 is connected to the collector of current mirror output transistor Q32. The bias voltage generator circuit 40 including transistors Q32, Q33, Q35 and Q36 uses the same Wilson current mirror circuit topography mentioned above, but composed of NPN rather than PNP transistors.

Differential input transistors Q1 and Q0 with tail current source $I_0$ and dynamic load current sources $I_9$ and $I_{10}$ and drive Class AB folded cascode stage 34A. The differential output of the input stage 11 including input transistors Q0 and Q1 is converted by class AB folded cascode stage 34A to the PNP current mirror including transistors Q28, Q29, Q30 and Q31, which converts the differential current signal Iout+– Iout– (FIG. 3) to a single-ended output on conductor 4, which drives an output buffer or gain stage 20, with the compensation capacitor C1 coupled between conductor 4 and either $V_{EE}$ (if gain stage 20 is a voltage follower) or the output of gain stage 20 (if gain stage 20 is an inverting gain stage with a large voltage gain).

The architecture of operational amplifier 10D can be used in a single stage topology. However, operational amplifier 10D it is not very flexible with respect to its input operating point voltage, which is just one base-emitter voltage (Vbe) above $V_{EE}$, which can be too low for some applications and too high for others. (The "input operating point voltage" is the common mode input voltage.)

Operational amplifier 10D of FIG. 4 is a low-noise circuit which takes advantage of the wider common mode input voltage range of the class AB folded cascode stage 34A of the present invention while requiring only a small quiescent current when the operational amplifier output slew rate is high.

Operational amplifier 10D of FIG. 4 utilizes the folded cascode topology with the cascode transistors Q20 and Q21 conducting much less current than the input transistors Q0 and Q1. This keeps the common mode input voltage range wide while cascode transistors Q20 and Q21 contribute less noise due to their lower transconductance Gm. The additional quiescent current required by class AB folded cascode stage 34A is relatively small, and at the same time it transfers the full amount of tail current $I_0$ from input stage 11 to the compensation capacitor C1. This provides the good output slew rate. Specifically, class AB folded cascode stage 34A conducts less current than the operational amplifier input stage 11. Also, class AB folded cascode stage 34A is boosted (wherein current through the folded cascode stage 19A is increased to absorb current from input stage 11) only during slewing. Due to lower DC current through class AB folded cascode stage 34A, the impedance at conductor 4 is higher, which increases the DC gain of operational amplifier 10D. The lower DC currents through the cascode transistors of AB folded cascode circuit 34A, resulting in lower noise contribution.

In essence, class AB folded cascode stage 34A is a linear-current-transfer stage which does not contribute much distortion to the amplified signal. This is unlike traditional slew boost techniques, which typically operate in a nonlinear mode that generates additional distortion. An improved common mode input voltage range is achieved without unacceptably increasing noise level, and a high output slew rate is achieved which results in improved operational amplifier settling times.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, class AP folded cascode stage 34A in FIG. 3 can be implemented with field effect transistors instead of bipolar transistors. Or, as another example, the class AB folded cascode stage in FIG. 3 can be used in a 2 (or more) stage operational amplifier topology rather than the described single gain stage topology.

What is claimed is:

1. A class AB folded cascode circuit comprising:
   (a) a differential current follower circuit including
   i. first and second cascode transistors each having a first electrode, a second electrode, and a control electrode, the control electrodes being coupled to a bias voltage source; the differential current follower circuit having a first input conductor coupled to the first electrode of the first cascode transistor, a second input conductor coupled to the first electrode of the second cascode transistor, a first output conductor coupled to the second electrode of the first cascode transistor, and a second output conductor coupled to the second electrode of the second cascode transistor;
   ii. a first current mirror circuit having an input coupled to the first input conductor and an output coupled to the second output conductor; and
   iii. a second current mirror circuit having an input coupled to the second input conductor and an output coupled to the first output conductor;
   the differential current follower circuit producing a differential output current at the first and second output conductors which follows a differential input current applied at the first and second input conductors; and
   (b) a third current mirror circuit for performing a conversion of differential output current in the first and second output conductors to a corresponding single-ended output voltage on the second output conductor;
   wherein the output of the first current mirror circuit is coupled to the second output conductor by means of a third cascode transistor having a first electrode coupled to the output of the first current mirror circuit, a second electrode coupled to the second output conductor, and a control electrode coupled to the bias voltage source; and wherein the output of the second current mirror circuit is coupled to the first output conductor by means of a fourth cascode transistor having a first electrode coupled to the output of the second current mirror circuit, a second electrode coupled to the first output conductor, and a control electrode coupled to the bias voltage source.

2. The class AB folded cascode circuit of claim 1 wherein each first electrode is an emitter, each second electrode is a collector, and each control electrode is a base.

3. A class AB folded cascode circuit comprising:
(a) a differential current follower circuit including
  i. first and second cascode transistors each having a first electrode, a second electrode, and a control electrode, the control electrodes being coupled to a bias voltage source; the differential current follower circuit having a first input conductor coupled to the first electrode of the first cascode transistor, a second input conductor coupled to the first electrode of the second cascode transistor, a first output conductor coupled to the second electrode of the first cascode transistor, and a second output conductor coupled to the second electrode of the second cascode transistor;
  ii. a first current mirror circuit having an input coupled to the first input conductor and an output coupled to the second output conductor; and
  iii. a second current mirror circuit having an input coupled to the second input conductor and an output coupled to the first output conductor;
  the differential current follower circuit producing a differential output current at the first and second output conductors which follows a differential input current applied at the first and second input conductors; and
(b) a third current mirror circuit for performing a conversion of differential output current in the first and second output conductors to a corresponding single-ended output voltage on the second output conductor;
wherein a differential output current produced between the first and second output conductors in response to a differential input current applied between the first and second input conductors is equal to the differential input current.

4. A class AB folded cascode circuit comprising:
(a) a differential current follower circuit including
  i. first and second cascode transistors each having a first electrode, a second electrode, and a control electrode, the control electrodes being coupled to a bias voltage source; the differential current follower circuit having a first input conductor coupled to the first electrode of the first cascode transistor, a second input conductor coupled to the first electrode of the second cascode transistor, a first output conductor coupled to the second electrode of the first cascode transistor, and a second output conductor coupled to the second electrode of the second cascode transistor;
  ii. a first current mirror circuit having an input coupled to the first input conductor and an output coupled to the second output conductor; and
  iii. a second current mirror circuit having an input coupled to the second input conductor and an output coupled to the first output conductor;
  the differential current follower circuit producing a differential output current at the first and second output conductors which follows a differential input current applied at the first and second input conductors; and
(b) a third current mirror circuit for performing a conversion of differential output current in the first and second output conductors to a corresponding single-ended output voltage on the second output conductor;
wherein the first current mirror circuit includes a first current mirror input transistor having a first electrode coupled to a first reference voltage and a control electrodes and a second electrode coupled to the first input conductor; and a first current mirror output transistor having a first electrode coupled to the first reference voltage, a control electrode coupled to the control electrode of the first current mirror input transistor, and a second electrode coupled to the second output conductor; and
wherein the second current mirror circuit includes a second current mirror input transistor having a first electrode coupled to the first reference voltage and a control electrode and a second electrode coupled to the second input conductor; and a second current mirror output transistor having a first electrode coupled to the first reference voltage, a control electrode coupled to the control electrode of the second current mirror input transistor, and a second electrode coupled to the first output conductor.

5. The class AB folded cascode circuit of claim 4 including a bias circuit coupled to produce the bias voltage on the control electrodes of the first and second cascode transistors.

6. The class AB folded cascode circuit of claim 5 wherein the bias circuit includes a third current mirror input transistor having a first electrode coupled to the first reference voltage; a third current mirror output transistor having a first electrode coupled to the first reference voltage, a control electrode coupled to a control electrode and a second electrode of the third current mirror input transistor; a diode-connected transistor having a first electrode coupled to a second electrode of the third current mirror output transistor, and a second electrode and a control electrode coupled to a bias current source; and a follower transistor having a first electrode coupled to the second electrode of the third current mirror input transistor and a control electrode coupled to the second electrode and control electrode of the diode-connected transistor; the bias voltage being produced on the control electrode of the diode-connected transistor.

7. An operational amplifier circuit comprising:
(a) an input stage including first and second input transistors coupled to a tail current source and to first and second load devices, respectively;
(b) a class AB folded cascode circuit including
  1) a differential current follower circuit including
    i. first and second cascode transistors each having a first electrode, a second electrode, and a control electrode, the control electrodes being coupled to a bias voltage source; the differential current follower circuit having a first input conductor coupled to the first electrode of the first cascode transistor, a second input conductor coupled to the first electrode of the second cascode transistor, a first output conductor coupled to the second electrode of the first cascode transistor, and a second output conductor coupled to the second electrode of the second cascode transistor;
    ii. a first current mirror circuit having an input coupled to the first input conductor and an output coupled to the second output conductor; and
    iii. a second current mirror circuit having an input coupled to the second input conductor and an output coupled to the first input conductor;
    the differential current follower circuit producing a differential output current at the first and second conductors which follows a differential input current applied at the first and second input conductors; and 2) a third current mirror circuit for performing a conversion of differential output current in the first and second output conductors to a corresponding single-ended output voltage on the second output conductor; and (c) an output stage having an input coupled to one of the first and second output conductors.

8. The operational amplifier circuit of claim 7 wherein each first electrode is an emitter, each second electrode is a collector, and each control electrode is a base.

9. The operational amplifier circuit of claim 7
wherein the output of the first current mirror circuit is coupled to the second output conductor by means of a third cascode transistor having a first electrode coupled to the output of the first current mirror circuit, a second electrode coupled to the second output conductor, and a control electrode coupled to the bias voltage source; and
wherein the output of the second current mirror circuit is coupled to the first output conductor by means of a fourth cascode transistor having a first electrode coupled to the output of the second current mirror circuit, a second electrode coupled to the first output conductor, and a control electrode coupled to the bias voltage source.

10. The operational amplifier circuit of claim 7 wherein a differential output current produced between the first and second output conductors in response to a differential input current applied between the first and second input conductors is equal to the differential input current.

11. The operational amplifier circuit of claim 7
wherein the first current mirror circuit includes a first current mirror input transistor having a first electrode coupled to a first reference voltage and a control electrode, and a second electrode coupled to the first input conductor; and a first current mirror output transistor having a first electrode coupled to the first reference voltage, a control electrode coupled to the control electrode of the first current mirror input transistor, and a second electrode coupled to the second output conductor; and
wherein the second current mirror circuit includes a second current mirror input transistor having a first electrode coupled to the first reference voltage and a control electrode, and a second electrode coupled to the second input conductor; and a second current mirror output transistor having a first electrode coupled to the first reference voltage, a control electrode coupled to the control electrode of the second current mirror input transistor, and a second electrode coupled to the first output conductor.

12. The operational amplifier circuit of claim 7 including a bias circuit coupled to produce the bias voltage on the control electrodes of the first and second cascode transistors.

13. The operational amplifier of claim 7 wherein the third current mirror circuit includes a third current mirror input transistor having a first electrode coupled to a second reference voltage; third current mirror output transistor having a first electrode coupled to the second reference voltage, a control electrode coupled to a control electrode and a second electrode of the third current mirror input transistor; a diode-connected transistor having a first electrode coupled to a second electrode of the third current mirror output transistor and a second electrode and a control electrode coupled to the first output conductor; and a follower transistor having a first electrode coupled to the second electrode of the third current mirror input transistor, a second electrode coupled to the second output conductor, and a control electrode coupled to the second electrode and control electrode of the third current mirror output transistor.

14. The operational amplifier of claim 12 wherein the bias circuit includes a third current mirror input transistor having a first electrode coupled to the first reference voltage; a third current mirror output transistor having a first electrode coupled to the first reference voltage, a control electrode coupled to a control electrode and a second electrode of the third current mirror input transistor; a diode-connected transistor having a first electrode coupled to a second electrode of the third current mirror output transistor and a second electrode and a control electrode coupled to a bias current source; and a follower transistor having a first electrode coupled to the second electrode of the third current mirror input transistor, and a control electrode coupled to the second electrode and control electrode of the third current mirror output transistor; the bias voltage being produced on the control electrode of the diode-connected transistor.

15. The operational amplifier circuit of claim 14 wherein the bias voltage causes the quiescent current through the first differential current follower circuit to be much lower than a tail current supplied by the tail current source.

16. The operational amplifier circuit of claim 7 including a compensation capacitor coupled to the input of the output circuit.

* * * * *